US008022774B2

(12) United States Patent
Ueno et al.

(10) Patent No.: US 8,022,774 B2
(45) Date of Patent: Sep. 20, 2011

(54) PHASE-LOCKED LOOP CIRCUIT, RECORDING-AND-REPRODUCING APPARATUS, AND ELECTRONIC APPARATUS

(75) Inventors: Yosuke Ueno, Kanagawa (JP); Tetsuya Fujiwara, Kanagawa (JP)

(73) Assignee: Sony Corporation, Tokyo (JP)

( * ) Notice: Subject to any disclaimer, the term of this patent is extended or adjusted under 35 U.S.C. 154(b) by 7 days.

(21) Appl. No.: 12/458,726

(22) Filed: Jul. 21, 2009

(65) Prior Publication Data

US 2010/0026405 A1  Feb. 4, 2010

(30) Foreign Application Priority Data

Jul. 31, 2008  (JP) .................................. 2008-197474

(51) Int. Cl.
  *H03L 7/085*  (2006.01)
(52) U.S. Cl. ............................................ 331/17; 331/16
(58) Field of Classification Search .................... 331/17, 331/16
  See application file for complete search history.

(56) References Cited

U.S. PATENT DOCUMENTS

| 7,146,143 | B2 | 12/2006 | Oosawa et al. | |
| 7,323,944 | B2 | 1/2008 | Florescu et al. | |
| 2005/0180287 | A1* | 8/2005 | Lee et al. | 369/59.15 |
| 2007/0273415 | A1* | 11/2007 | Kimura et al. | 327/157 |
| 2008/0042759 | A1* | 2/2008 | Watanabe | 331/17 |

FOREIGN PATENT DOCUMENTS

| JP | 06-152567 | A | 5/1994 |
| JP | 09-153795 | A | 6/1997 |
| JP | 09-312565 | A | 12/1997 |
| JP | 10-084279 | | 3/1998 |
| JP | 10-098376 | A | 4/1998 |
| JP | 11-298321 | A | 10/1999 |
| JP | 2002-100984 | A | 4/2002 |
| JP | 2005-236976 | A | 9/2005 |

OTHER PUBLICATIONS

Japanese Office Action issued May 25, 2010 for corresponding Japanese Application No. 2008-197474.
Office Communication from U.S. Patent and Trademark Office for U.S. Appl. No. 12/458,706 dated Apr. 19, 2011.

* cited by examiner

*Primary Examiner* — Joseph Chang
(74) *Attorney, Agent, or Firm* — Rader, Fishman & Grauer PLLC

(57) ABSTRACT

A phase-locked loop circuit includes a phase detection unit which detects phase information of an input signal, a loop filter unit including a series circuit of a resistor and a capacitor, first and second pulse-current output units which supply pulse currents corresponding to the phase information output to one and the other of the resistor and the capacitor, and an oscillating unit capable of varying an oscillation frequency in accordance with a component obtained by combining a voltage generated at both ends of the one of the resistor and the capacitor on the basis of the pulse current supplied from the output terminal of the first pulse-current output unit and a voltage generated at both ends of the other one of the resistor and the capacitor on the basis of the pulse current supplied from the output terminal of the second pulse-current output unit.

22 Claims, 10 Drawing Sheets

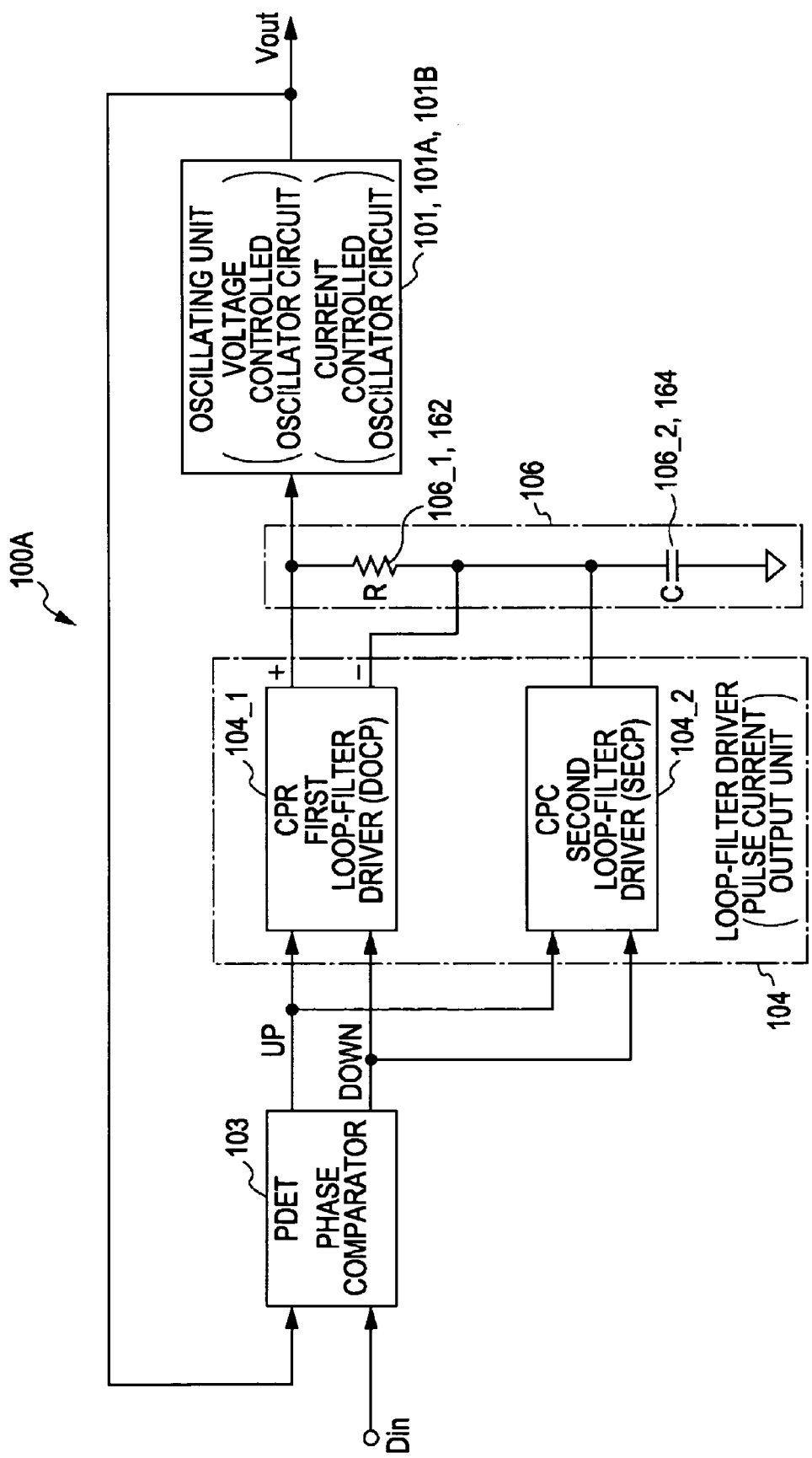

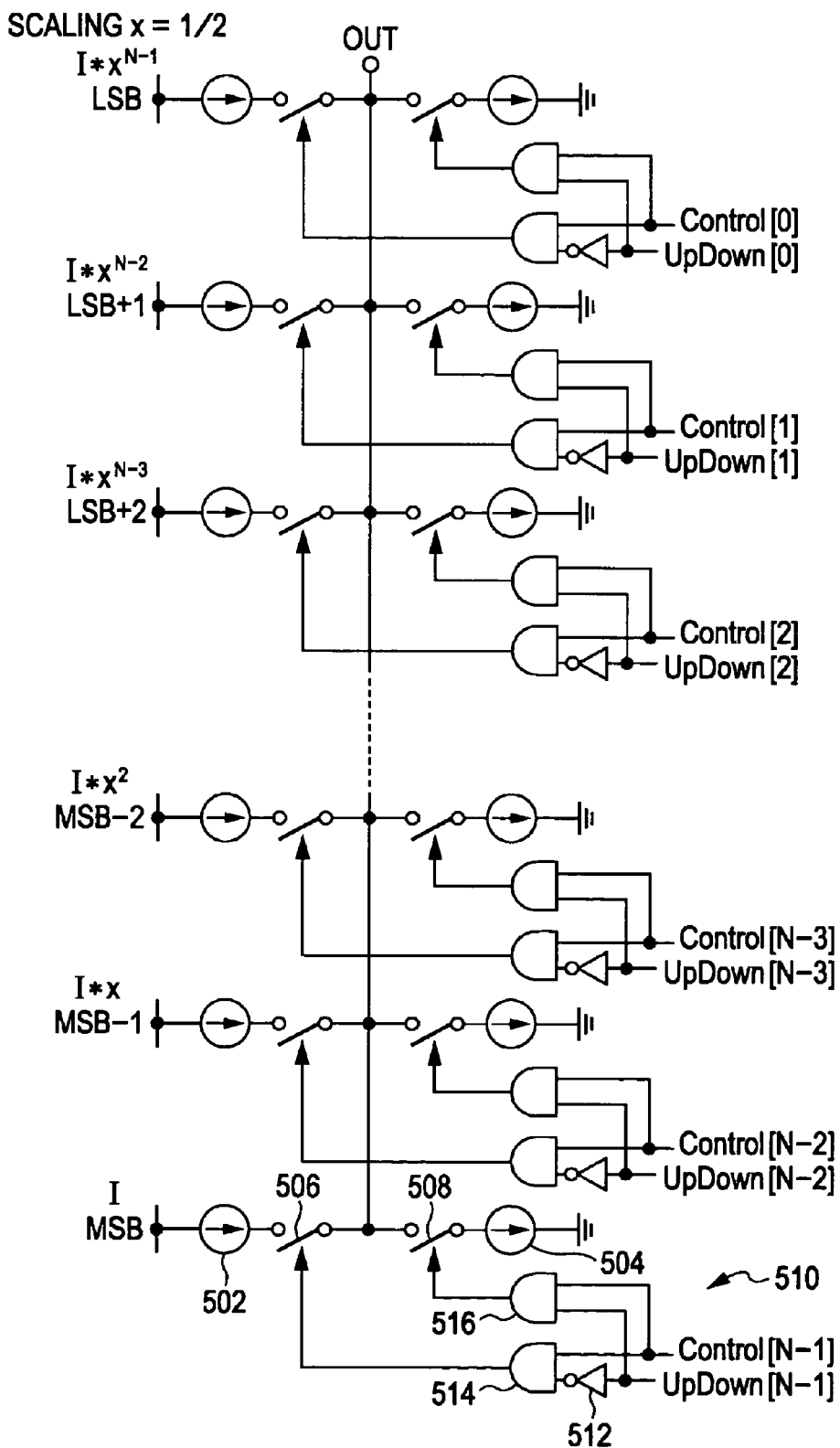

FIG. 8 DIFFERENTIAL OUTPUT DA CONVERSION CIRCUIT DODAC (CURRENT OUTPUT)
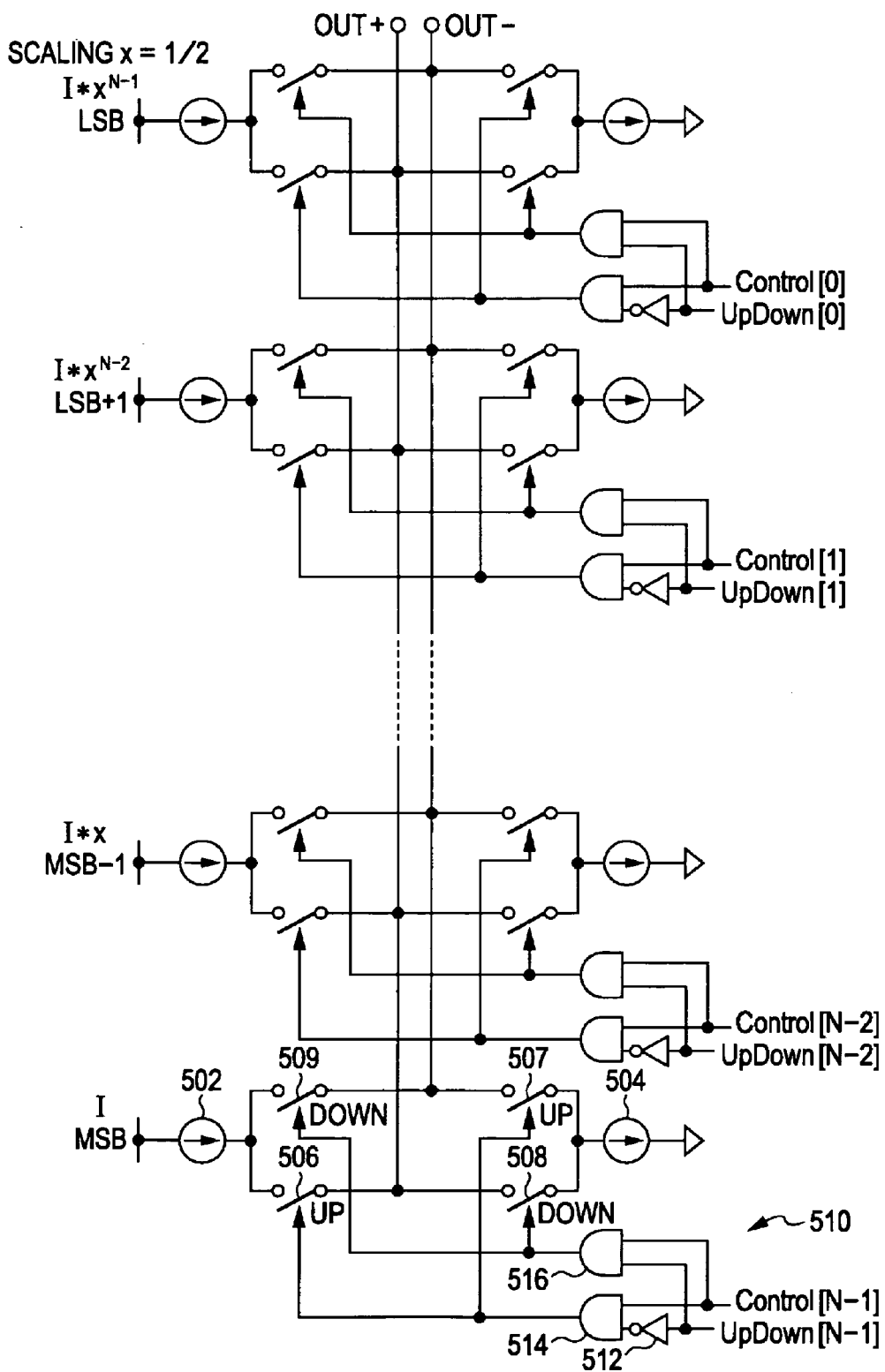

PHASE-LOCKED LOOP CIRCUIT, RECORDING-AND-REPRODUCING APPARATUS, AND ELECTRONIC APPARATUS

BACKGROUND OF THE INVENTION

1. Field of the Invention

The present invention relates to a phase-locked loop (PLL) circuit used in various types of electronic apparatuses, for example, in communication apparatuses, such as a television receiver and a mobile phone, for receiving or transmitting information, or in read/write apparatuses, such as an optical disk apparatus. The present invention also relates to an electronic apparatus, such as a read/write apparatus, including the phase-locked loop (PLL) circuit.

2. Description of the Related Art

In general, phase-locked loop (PLL) circuits are installed in various types of electronic apparatuses, such as a communication apparatus, a transmitting-and-receiving apparatus, and an optical disk apparatus, for producing an oscillation signal with high spectrum precision or for generating a frequency-locked and phase-locked clock signal for a data signal. Examples of apparatuses including the PLL circuits include a wireless communication apparatus, such as a mobile phone, a serial communication system using various cables, and a digital data recovery system (read channel) for recovery digital data written on a disk medium.

FIG. 9A is a circuit block diagram of a common phase-locked loop circuit 100Z. As shown in FIG. 11A, the phase-locked loop circuit 100Z includes an oscillating unit 101 provided with a frequency divider 102. The oscillating unit 101 generates an output oscillation signal Vout with an oscillation frequency fosci on the basis of an oscillation control signal CN (oscillation control current Icnt in this example). The frequency divider 102 divides the oscillation frequency fosci of the output oscillation signal Vout into $1/\alpha$ to generate a frequency-divided oscillation signal Vout1. In this example, the oscillating unit 101 includes a current controlled oscillator (CCO) circuit 101B. However, the oscillating unit 101 may also include a voltage controlled oscillator (VCO) circuit.

The phase-locked loop circuit 100Z also includes a phase comparator 103, a current-output loop-filter driver 104 including a charge pump circuit, and a loop filter unit 106. The phase comparator 103 compares an input signal Vin with the output oscillation signal Vout from the oscillating unit 101 or the frequency-divided oscillation signal Vout1 from the frequency divider 102, and outputs a comparison result signal Comp which represents a phase difference as a result of the comparison. The phase-locked loop circuit including the loop-filter driver 104 which includes the charge pump circuit will hereinafter be referred to as a charge-pump PLL.

The loop-filter driver 104 receives the comparison result signal Comp from the phase comparator 103 and outputs a pulsed charge-pump current Icp which corresponds to the comparison result signal Comp. The loop filter unit 106 includes at least a capacitor element 164 (loop filter capacitor) with a capacitance C. The loop filter unit 106 generates the oscillation control signal CN for controlling the oscillation frequency fosci of the oscillating unit 101 using a charge voltage Vcp of the capacitor element 164 based on the charge-pump current Icp from the loop-filter driver 104. In this example, the loop filter unit 106 includes a resistor element (loop filter resistor) with a resistance R in addition to the capacitor element 164.

In the phase-locked loop circuit 100Z having the above-described structure, the input signal Vin and the output oscillation signal Vout from the oscillating unit 101 (or the frequency-divided oscillation signal Vout1 from the frequency divider 102) are input to the phase comparator 103, and the phase comparator 103 outputs the comparison result signal Comp which represents a phase error. The oscillating unit 101 is oscillated by means of the charge-pump PLL on the basis of the comparison result signal Comp. Thus, the phase of the output oscillation signal Vout is locked to that of the input signal Vin.

The phase-locked loop circuit preferably has good jitter performance and a short lock time. These factors can be optimized by adequately setting a natural frequency ωn and a damping factor ζ of the phase-locked loop circuit to suitable values. A linearized closed-loop transfer function is generally used for the analysis of the charge-pump PLL. The natural frequency ωn and the damping factor ζ can be expressed as Equations (1-1) and (1-2) (Expression (1)) given below using a circuit gain of the loop-filter driver 104 (hereinafter referred to as CP circuit gain Kcp), an input-signal/oscillation-frequency conversion gain Kosci of the oscillating unit 101 (VCO circuit gain Kvco in Expression (1)), the resistance R of the resistor element, and the capacitance C of the capacitor element 164.

$$\left.\begin{array}{l}\omega_n = \sqrt{\dfrac{K_{CP}K_{VCO}}{C}} \quad (1\text{-}1)\\[6pt]\zeta = \dfrac{RC}{2}\omega_n \quad (1\text{-}2)\end{array}\right\} \quad (1)$$

In the case where the phase-locked loop circuit 100Z having the above-described structure is used, if the input signal frequency or the data rate varies, the natural frequency ωn is preferably varied in accordance with the input frequency while the damping factor ω is maintained constant. For example, in a data recovery system for recovery data recorded on a disc medium, the data rate varies by a factor of about 2 between an inner periphery and an outer periphery of the disc. Therefore, the natural frequency ωn is preferably varied in accordance with the data rate. According to Equation (1-1), the natural frequency ωn can be varied by controlling the CP circuit gain Kcp, the VCO circuit gain Kvco, and the capacitance C. At the same time, according to Equation (1-2), the damping factor ζ can be maintained constant by varying the capacitance C and the resistance R.

In the case where the phase-locked loop circuit 100Z is manufactured as an integrated circuit (IC), a chip area for the capacitor element 164 is generally larger than that for the resistor element. Therefore, when the PLL circuit is manufactured as an IC, it is economically disadvantageous to provide many capacitor elements to make the capacitance C variable.

In view of the above situation, the capacitance C may be set constant and a plurality of resistor elements may be provided in a switchable manner so that the resistance R can be set to various values. However, in the structure including a plurality of resistor elements which can be switched by respective switches, in the case where it is necessary to switch a time constant C·R of the loop filter unit 106 in multiple steps, a large number of resistor elements are arranged together with respective switches and are subjected to switching control. Therefore, it may be difficult to form the phase-locked loop circuit as an IC depending on the use thereof.

Accordingly, there has been a demand for a PLL circuit which can be formed as an IC irrespective of the use thereof. To comply with such a demand, a structure described in, for example, Japanese Unexamined Patent Application Publication No. 1-84279 (hereinafter referred to as Patent Document 1), has been proposed.

FIG. 9B shows a phase-locked loop circuit disclosed in Patent Document 1. In the structure described in Patent Document 1, a loop filter is composed of an integration circuit (only a capacitor element (capacitor 15) is provided in FIG. 1 of Patent Document 1), and a voltage-current conversion circuit (gm amplifier 16) which converts a voltage generated by the integration circuit into a current is provided. A first charge pump (charge pump circuit 13) is provided to drive the integration circuit, and a second charge pump (charge pump circuit 14) is additionally provided. In addition, an adding unit (adder 17) for adding a current from the second charge pump and a current from the voltage-current conversion circuit is also provided. With this structure, a circuit equivalent to a CR loop filter can be formed and a phase-locked loop circuit which can be easily formed as an IC can be obtained.

The natural frequency ωn and the damping factor ζ of the phase-locked loop circuit described in Patent Document 1 can be expressed as Equations (2-1) and (2-2) (Expression (2)) given below using a circuit gain (hereinafter referred to as a CPC circuit gain Kcpc) of the first charge pump for driving the integration circuit, a circuit gain (hereinafter referred to as a CPR circuit gain Kcpr) of the second charge pump, and a gain gm of the voltage-current conversion circuit.

$$\left. \begin{array}{l} \omega_n = \sqrt{\dfrac{K_{CPC} g_m K_{CCO}}{C}} \quad (2\text{-}1) \\ \zeta = \dfrac{CK_{CPR}}{2 g_m K_{CPC}} \omega_n \quad (2\text{-}2) \end{array} \right\} \quad (2)$$

As is clear from Expression (2), the natural frequency ωn and the damping factor ζ can be varied without changing the capacitance C or the resistance R by varying the circuit gains (CPC circuit gain Kcpc and CPR circuit gain Kcpr) of the two charge pumps and the gain gm of the voltage-current conversion circuit. Thus, the natural frequency ωn can be varied while, for example, the damping factor ζ is maintained constant, as described above.

As is clear from the comparison between Expressions (1) and (2), the resistance R in Expression (1) corresponds to (CPR circuit gain Kcpr)/(gm·(CPC circuit gain Kcpc)). These gains can be easily varied.

SUMMARY OF THE INVENTION

In the structure of Patent Document 1, the natural frequency ωn and the damping factor ζ of the phase-locked loop circuit can be varied without switching between the resistance elements or the capacitance elements 164. However, the structure has the following problems.

The first problem is noise generated by the voltage-current conversion circuit. The accuracy of the output signal is the most important performance for the phase-locked loop circuit, and this performance depends on the amount of noise in the phase-locked loop circuit. Therefore, the addition of the voltage-current conversion circuit often causes considerable degradation of the performance of the phase-locked loop circuit.

The second problem is the necessity of the voltage-current conversion circuit itself. Although the voltage-current conversion circuit has been widely used, it is a typical analog circuit and the process of designing analog circuits is generally troublesome. In addition, since the voltage-current conversion circuit is additionally provided, the chip area is increased accordingly.

The third problem is non-linearity due to the addition of the currents. In this structure, the sum of the output current from the voltage-current conversion circuit and the output current of one of the charge pump circuits is supplied to the oscillation circuit. If, for example, a ring oscillation circuit is used as the oscillation circuit, the relationship between an input voltage and an output frequency is substantially linear. However, the relationship between an input current and the output frequency is non-linear and shows square-root characteristic. This may cause a problem regarding the characteristics.

This problem has been pointed out in, for example, Japanese Unexamined Patent Application Publication No. 2003-318729, and a structure including a current squared circuit for cancelling the square root characteristic has been proposed as a countermeasure against the problem. However, similar to the addition of the voltage-current conversion circuit, the addition of the current squared circuit also causes the problems of noise, cumbersome design process, and chip area.

As described above, the structure of Patent Document 1 is advantageous in view of versatility of the natural frequency ωn and the damping factor ζ. However, there are still problems regarding the noise performance, the circuit scale, and design and verification processes. Thus, a phase-locked loop (PLL) circuit which can solve all of the problems has not yet been developed. Accordingly, there has been a demand for a new phase-locked loop circuit that is improved in terms of one or more of the versatility of the natural frequency ωn and the damping factor ζ, the noise performance, the circuit scale, and the design and verification processes. If such a new phase-locked loop circuit is provided, the range of choices of phase-locked loop circuits in accordance with the use thereof can be broadened.

In view of the above-described circumstances, it is desirable to provide a phase-locked loop circuit having a new circuit structure that is different from the structures according to the related art, thereby broadening the range of choices of phase-locked loop circuits in accordance with the use thereof. Preferably, also in the new circuit structure, the natural frequency ωn and the damping factor ζ can be varied irrespective of the use thereof. In addition, preferably, an improvement in terms of one or more of the noise performance, the circuit scale, and the design and verification processes is also provided. More preferably, a structure in which the noise performance, the circuit scale, and the design and verification processes are balanced is also provided.

In the structure according to an embodiment of the present invention, a loop filter unit includes a series circuit of a resistor circuit and a capacitor circuit. An end of the capacitor circuit opposite the resistor circuit is connected to a reference point. The resistor circuit and the capacitor circuit are driven by two pulse-current output units. According to this structure, the oscillating unit can be controlled on the basis of the voltages generated at both ends of the resistance circuit and the capacitance circuit.

Since the resistance circuit and the capacitance circuit are connected in series, the voltages can be added and matching with the voltage controlled oscillator circuit may be ensured. An interface with a current controlled oscillator circuit may, of course, be applied.

Preferably, one of the resistance circuit and the capacitance circuit receives a single-end output, and the other receives a differential output. When one of the resistance circuit and the capacitance circuit receives a single-end output, and the other receives a differential output, voltages at both ends the resistor circuit and the capacitor circuit are independent of each other. Therefore, the operation of adjusting the natural frequency and the damping factor independently of each other can be facilitated.

According to an embodiment of the present invention, a new phase-locked loop circuit is provided which is capable of varying the natural frequency ωn and the damping factor without switching between the resistor circuits or the capacitor circuits, as in Patent Document 1. In addition, the range of choices of phase-locked loop circuits in accordance with the use thereof can be broadened.

BRIEF DESCRIPTION OF THE DRAWINGS

FIG. 3 is a diagram illustrating the basic structure of a phase-locked loop unit according to a first embodiment;

FIG. 7 is a diagram illustrating an example of the structure of a single-end-output DA converter circuit;

FIG. 8 is a diagram illustrating an example of the structure of a differential-output DA converter circuit;

DESCRIPTION OF THE PREFERRED EMBODIMENTS

Figure 1:
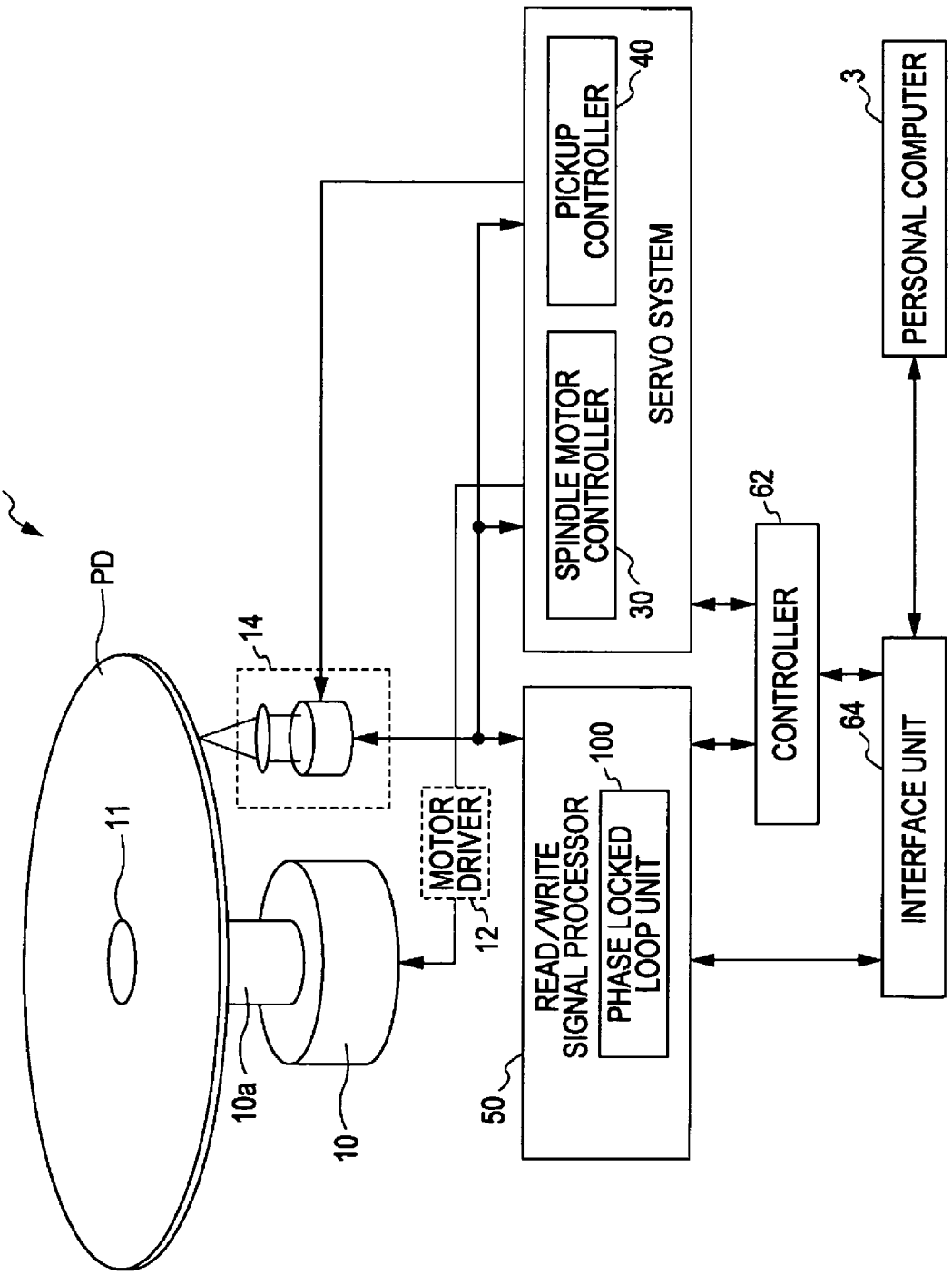
FIG. 1 is a block diagram illustrating a read/write apparatus according to an embodiment of the present invention.

Embodiments of the present invention will be described in detail below with reference to the accompanying drawings. Functional elements corresponding to different embodiments are denoted by reference numerals with capital letters A, B, C, . . . , at the end to distinguish them from each other, and the capital letters are omitted when it is not necessary to distinguish them from each other. This also applies to the drawings.

Outline of Read/Write Apparatus

FIG. 1 is a block diagram illustrating a read/write apparatus (optical disk apparatus) according to an embodiment. The read/write apparatus is an example of an electronic apparatus including a phase-locked loop circuit.

A read/write apparatus 1 of the present embodiment includes an optical pickup 14 having a laser source for writing additional information on an optical disk PD (photo disk) or for reading the information recorded on the optical disk PD. The read/write apparatus 1 also includes a servo system, a read/write system, and a controller system as a signal processing system. The servo system of the read/write apparatus 1 includes a rotation servo system, a tracking servo system, and a focus servo system. A system including the tracking servo system and the focus servo system is also referred to as a pickup servo system.

The optical disk PD may be, for example, a so-called read only optical disk, such as a compact disk (CD) or a CD read only memory (CD-ROM), a write once optical disk, such as a CD recordable (CD-R), or a rewritable optical disk such as a CD rewritable (CD-RW). Alternatively, instead of the CD-type optical disk, a magneto-optical disk (MO) or a DVD-type optical disk, such as a common digital video (or versatile) disk (DVD) or a next generation DVD using a blue laser beam with a wavelength of about 407 nm, may also be used. In addition, a so-called double-density CD (DDCD), a double-density CD-R, or a double-density CD-RW, which is based on the current CD format but has a density that is about twice as high as that of the current CD format, may also be used.

The rotation servo system of the read/write apparatus 1 includes a spindle motor 10 which rotates the optical disk PD on which information, such as music, to be reproduced is recorded, a motor driver 12 which drives the spindle motor 10, and a spindle motor controller 30 which is an example of a rotation control unit (rotation servo system) which controls the motor driver 12.

Although not shown in FIG. 1, the spindle motor controller 30 has a rough servo circuit, a speed servo circuit, a phase servo circuit, and a selector for selectively transmitting outputs from the servo circuits.

The rough servo circuit roughly controls the rotational speed of optical disk PD. The speed servo circuit finely adjusts the rotational speed on the basis of a synchronization signal. The phase servo circuit matches a phase of a reproduction signal to a phase of a reference signal. The selector selectively transmits the outputs from the rough servo circuit, the speed servo circuit, and the phase servo circuit to the motor driver 12.

The optical disk PD is fixed to a rotating shaft 10a of the spindle motor 10 by means of a chuck 11. The spindle motor 10 is controlled by the motor driver 12 and the spindle motor controller 30 so that a linear speed is maintained constant. The linear speed can be gradually changed by the motor driver 12 and the spindle motor controller 30.

The read/write apparatus 1 includes a pickup controller 40 which serves as the tracking servo system and the focus servo system. The pickup controller 40 controls the position of the optical pickup 14 with respect to the optical disk PD in a radial direction thereof. Although not shown, the pickup controller 40 includes, for example, a sub-coding detector circuit and a tracking servo circuit. The sub-coding detector circuit reads sub-coding recorded on the optical disk PD. The tracking servo circuit controls the position of the optical pickup 14 with respect to the optical disk PD in the radial direction thereof on the basis of a tracking error signal detected by a tracking error detection circuit (not shown) and address information detected by the sub-coding detector circuit.

The pickup controller 40 controls a tracking actuator and a seek motor (not shown) so that a laser spot formed by a laser beam emitted from the optical pickup 14 is at a desired position (data writing position or data recovery position) on the optical disk PD.

The optical pickup 14 includes a semiconductor laser, an optical system, a focus actuator, the tracking actuator, a light receiving element, a position sensor, etc. (not shown). The optical pickup 14 irradiates a writing surface of the optical disk PD with the laser beam, receives the laser beam reflected by the optical disk PD, and converts the received laser beam into an electric signal. The semiconductor laser included in the optical pickup 14 is driven by a laser driver (not shown). The laser driver drives the semiconductor laser such that the semiconductor laser emits an optical beam with a predetermined recovery power in a data recovery process and an optical beam with a predetermined writing power in an information writing process.

The optical pickup 14 can be moved by the seek motor (slide motor) (not shown) in a sledge (radial) direction. The focus actuator, the tracking actuator, and the seek motor are controlled by the motor driver 12, the spindle motor controller 30, and the pickup controller 40 on the basis of signals obtained from the light receiving element and the position sensor. More specifically, the focus actuator, the tracking actuator, and the seek motor are controlled such that the laser spot of the laser beam is at the desired position (data writing position or data recovery position) on the optical disk PD.

The read/write apparatus 1 also includes a read/write signal processor 50 as a read/write system. The read/write signal processor 50 is an example of an information writing unit which records information through the optical pickup 14 and an information recovery unit which reproduces the information recorded on the optical disk PD. An example of the structure of the read/write signal processor 50 will be described below. The read/write signal processor 50 includes at least a phase-locked loop unit 100, which is an example of a phase-locked loop circuit.

The read/write apparatus 1 includes a controller 62 which serves as a control system and an interface unit 64 which has a function of interface (IF), that is, connection. The controller 62 is composed of a micro processing unit (MPU), and controls the operation of the servo system including the spindle motor controller 30 and the pickup controller 40 and the operation of the read/write signal processor 50. The interface unit 64 functions as an interface (connection) between the read/write apparatus 1 and a personal computer 3, which is an example of an information processing apparatus (host apparatus) which performs various information processes using the read/write apparatus 1. The interface unit 64 is provided with a host IF controller. The read/write apparatus 1 and the personal computer 3 form an information read/write system (optical disk system).

In the recovery process performed by the read/write apparatus 1 having the above-described structure, an optical signal is read from the optical disk PD by the optical pickup 14 and is converted into an electric signal by the light receiving element included in the optical pickup 14. The thus-obtained electric signal is transmitted to the servo system (control system) including the spindle motor controller 30 and the pickup controller 40 which control the spindle motor 10 and the optical pickup 14, respectively, and to the read/write signal processor 50 which performs a data read/write operation.

The spindle motor controller 30 and the pickup controller 40 adjust the rotational speed of the spindle motor 10 and the focusing and tracking operations performed by the optical pickup 14 on the basis of the electric signal under the control of the controller 62.

At the same time, the read/write signal processor 50 converts the obtained analog electric signal into digital data and decodes the digital data, and then transmits the decoded data to an apparatus, such as the personal computer 3, which uses the read/write apparatus 1. The personal computer 3 reproduces, for example, image and audio data based on the decoded data.

In the writing process for writing data on the optical disk PD, the spindle motor controller 30 and the pickup controller 40 rotate the optical disk PD at a constant speed under the control of the controller 62. In addition, opposite to the recovery process, the read/write signal processor 50 encodes the data and supplies the encoded data to the laser diode included in the optical pickup 14, so that the electric signal is converted into an optical signal and the information is recorded on the optical disk PD.

Outline of Read/Write Signal Processor

Figure 2:
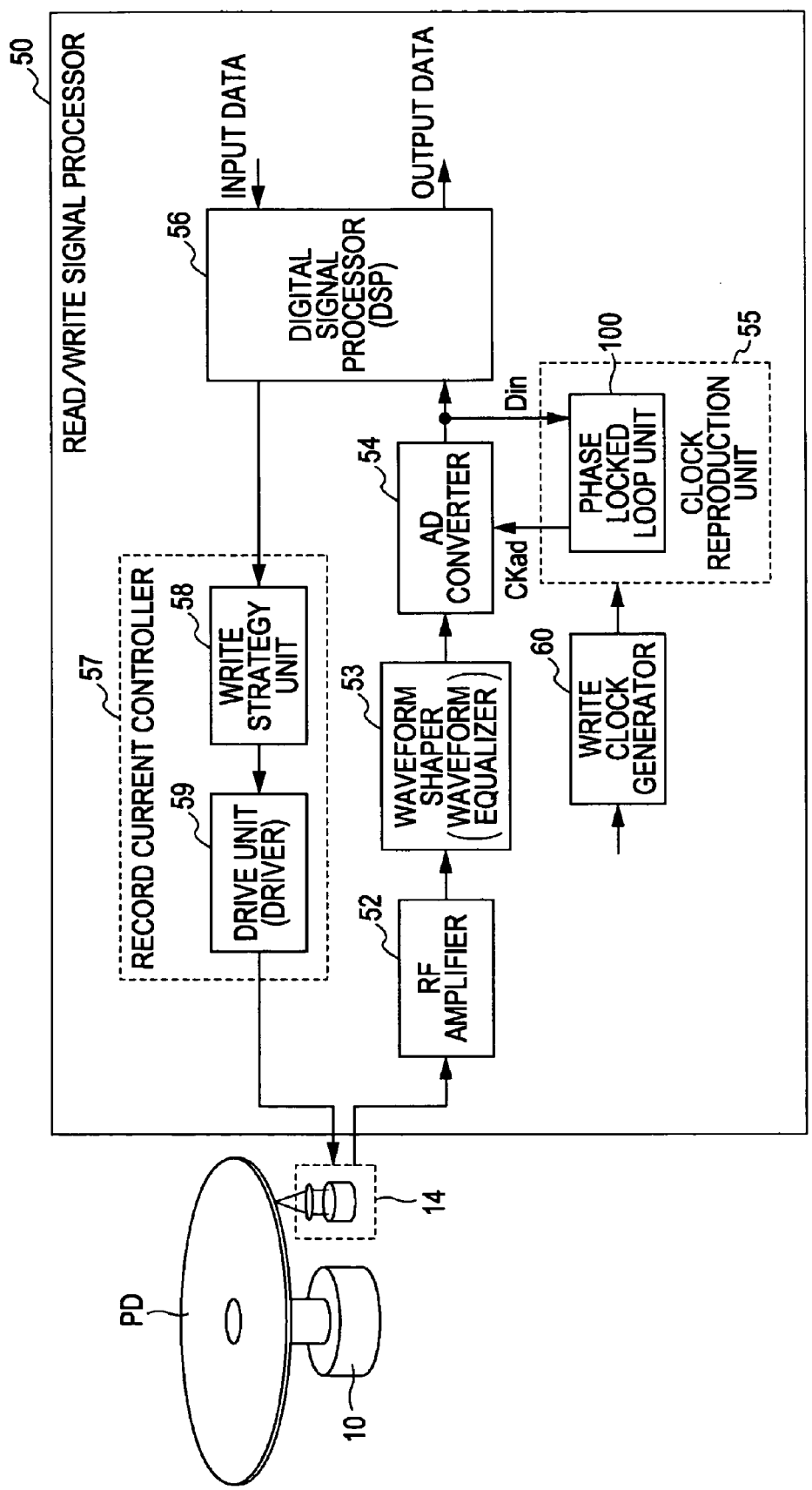
FIG. 2 is a functional block diagram illustrating an example of the structure of a read/write signal processor.

FIG. 2 is a functional block diagram illustrating an example of the structure of the read/write signal processor 50. As shown in FIG. 1B, the read/write signal processor 50 includes an RF amplifier 52, a waveform shaper (waveform equalizer) 53, and an AD converter (analog-to-digital converter (ADC)) 54. The RF amplifier 52 amplifies a low-level RF (high frequency) signal (hereafter also referred to as a reproduction RF signal) read by the optical pickup 14 to a predetermined level. The waveform shaper 53 shapes the reproduction RF signal output from the RF amplifier 52. The signal read by the optical pickup 14 has various frequencies, and the amplitude thereof decreases in a high frequency range. Therefore, intersymbol interference occurs and it becomes difficult to correctly reproduce the data. To prevent this, the waveform shaper 53 carries out waveform equalization for the signal output from the RF amplifier 52. The AD converter 54 converts the analog reproduction RF signal output from the waveform shaper 53 into digital data.

The read/write signal processor 50 also includes a clock reproduction unit 55, a digital signal processor (DSP) 56, a record current controller 57, and a write clock generator 60.

The clock reproduction unit 55 and the write clock generator 60 are examples of signal processors which perform signal processes based on a signal output from the phase-locked loop circuit.

The clock reproduction unit 55 reproduces a clock signal on the basis of a digital data sequence output from the AD converter 54. The clock reproduction unit 55 includes a data recovery phase-locked loop (PLL) circuit which locks onto the digital data (digital data sequence Din) obtained from the AD converter 54 and generates the clock signal. The phase-locked loop unit 100, which will be described below, is used as the phase-locked loop circuit. The clock reproduction unit 55 supplies the reproduced clock signal to the AD converter 54 as an AD clock (sampling clock) CKad and also supplies the reproduced clock signal to other functional parts. The AD converter 54 converts the analog signal into the digital data on the bass of the AD clock CKad.

The digital signal processor 56 performs digital signal processes, such as a process of demodulating the digital data sequence (which corresponds to the reproduction RF signal) output from the AD converter 54 and a process of decoding digital audio data and digital image data.

The record current controller 57 controls (switches on and off) a record current for writing the information on the optical disk PD with the laser beam. The record current controller 57 includes a write strategy unit 58 and a drive unit (laser diode driver) 59. The write strategy unit 58 carries out multi-pulse modulation of optical output power in accordance with the material of the optical disk PD and the writing speed. The drive unit 59 is provided with an auto power control (APC) circuit for maintaining an optical output (optical intensity, optical output power) of the laser beam emitted from the laser source (included in the optical pickup 14) at a constant value.

The write clock generator 60 generates a write clock on the basis of a reference clock supplied from a crystal oscillator or the like. The write clock is used to modulate data in the process of writing the information on the optical disk PD. The write clock generator 60 also includes a phase-locked loop (PLL) circuit, and the phase-locked loop unit 100, which will be described below, is used as the phase-locked loop circuit.

The writing optical beam emitted from the laser source is converted into parallel light by a collimator lens (not shown)

included in the optical pickup 14, is caused to pass through a beam splitter (not shown), and is focused by an objective lens (not shown) such that the writing optical beam is incident on the optical disk PD which is rotated by the spindle motor 10. At this time, the writing optical beam is modulated in accordance with the information to be recorded, so that a pit sequence corresponding to the information is formed at a predetermined position (information writing area) on the optical disk PD. Thus, the information is recorded on the optical disk PD. In the present embodiment, the write strategy unit 58 serves to prevent data errors due to deformation of pits (record marks).

Semiconductor lasers using semiconductor devices are widely used as light sources for various apparatuses since the semiconductor lasers are extremely small and are capable of responding to a drive current at a high speed. In addition, phase-change optical disks and magneto-optical disks are widely used as the rewritable optical disk PD which functions as a medium for read/write information. The optical disk PD is irradiated with the laser beam at different output levels depending on whether the information is being recorded, reproduced, or deleted.

In general, in the writing process, the laser beam is emitted at a high output level (for example, 30 mW or more) to form record marks called pits on the optical disk PD. In the recovery process, the laser beam is emitted toward the optical disk PD at a lower output level than that in the writing process (for example, 3 mW) so that the information can be read without damaging the record pits. To make an error rate low enough to allow the read/write processes using high-density, high-transmission-rate optical disks PD which have recently been developed, it is desirable to accurately control the intensity of the laser beam.

The optical output characteristics of the semiconductor laser with respect to the drive current considerably vary in accordance with the temperature variation. Therefore, a so-called APC control circuit, which is a circuit for maintaining the optical output of the semiconductor laser constant, is used to set the optical output to a desired intensity. In the APC control, the laser emission power is maintained constant by forming a negative feedback control loop in which a feedback current obtained by monitoring the optical signal used in the information writing operation is set to a predetermined power reference current.

Here, with the writable optical disk PD that has recently been developed, a mark edge writing method, in which changes at both ends of the record marks are recorded, is mainly used since the method is advantageous in increasing density. To reduce data errors due to deformation of the marks in the mark edge writing method, the write strategy unit 58 uses a write strategy technology in which multi-pulse modulation of the laser output power is performed in accordance with the material of the disk and the writing speed (see, for example, Japanese Unexamined Patent Application Publication 2000-244054).

Phase-Locked Loop Unit of First Embodiment

Basic Structure

FIG. 3 is a diagram illustrating the basic structure of a phase-locked loop unit 100 (phase-locked loop circuit) according to a first embodiment.

The basic structure of the phase-locked loop unit 100A according to the first embodiment is similar to that of the common phase-locked loop unit in that the phase-locked loop unit includes an oscillating unit 101, a phase comparator 103, a loop-filter driver 104 including a charge pump circuit, and a loop filter unit 106.

The loop filter unit 106 includes a series circuit of a first loop filter circuit 106_1 and a second loop filter circuit 106_2. The term "loop filter circuit" is a generic term including individual elements, such as a resistor element or a capacitor element, included in a circuit structure and series or parallel circuits including such elements.

The first loop filter circuit 106_1 is a resistor circuit which may include a resistor element and a capacitor element but the resistor element serves as a major element. For example, in the first embodiment, a resistance element 162 is used as the first loop filter circuit 106_1. The second loop filter circuit 106_2 is an integrating circuit (capacitor circuit) which includes a resistor element and a capacitor element but the capacitor element serves as a major element. For example, in the first embodiment, a capacitance element 164 is used as the second loop filter circuit 106_2. In the first embodiment, the resistor element 162 is connected to a connection point (node ND101) between the loop-filter driver 104 and the oscillating unit 101 at one end and to an end of the capacitor element 164 at the other end. The connection point between the resistor element 162 and the capacitor element 164 is hereinafter called a node ND 102. The other end of the capacitor element 164 is connected to a reference point (ground or a negative source, hereinafter the same). In the case where the manner in which the capacitor element 164 and the resistor element 162 are connected is reversed, there will be a problem that it is difficult to apply the current of the RD path. However, in the above-described connection, such a problem does not occur. In the case where the phase-locked loop unit 100 is formed of a semiconductor integrated circuit (IC), the resistor element 162 is preferably included in the IC, and the capacitor element 164 is disposed outside the IC and is connected to the IC.

The loop-filter driver 104 included in the phase-locked loop unit 100A of the first embodiment includes a first loop-filter driver 104_1 for driving the first loop filter circuit 106_1 and a second loop-filter driver 104_2 for driving the second loop filter circuit 106_2. The first loop-filter driver 104_1 and the second loop-filter driver 104_2 receive a common up signal UP and a common down signal DOWN (also generically referred to as an up/down signal UP/DOWN) as a comparison output from the phase comparator 103. The up/down signal UP/DOWN is an error signal (phase error information) representing a phase difference obtained as a result of a comparison between the phases of the digital data sequence Din and the output oscillation signal Vout. Although the first loop-filter driver 104_1 and the second loop-filter driver 104_2 use the up/down signal UP/DOWN from the phase comparator 103 as a common signal, operations thereof are independent of each other.

In the basic structure of the first embodiment, the first loop-filter driver 104_1 has a differential output structure which differentially outputs a pulse current with a pulse width corresponding to the phase error information to the first loop filter circuit 106_1. The second loop-filter driver 104_2 has a single-end output structure which outputs a pulse current with a pulse width corresponding to the phase error information to the second loop filter circuit 106_2. The first loop-filter driver 104_1 is an example of a differential pulse output unit and the second loop-filter driver 104_2 is an example of a single-end pulse output unit. The oscillation frequency of the oscillating unit 101 can be varied by varying the output currents from the pulse output units.

The first loop-filter driver 104_1 outputs a differential-output pulse current corresponding to the phase error information on the basis of the up/down signal UP/DOWN from the phase comparator 103. For example, the first loop-filter driver 104_1 is connected to a connection point (node ND101) between the resistor element 162 and the oscillating unit 101 at a positive-phase output terminal (OUT+) thereof and to a connection point between the resistor element 162 and the capacitor element 164 at a negative-phase output terminal (OUT−) thereof.

The second loop-filter driver 104_2 outputs a single-end-output pulse current corresponding to the phase error information on the basis of the up/down signal UP/DOWN from the phase comparator 103. The single-end output terminal (OUT) of the second loop-filter driver 104_2 is connected to the connection point between the resistor element 162 and the capacitor element 164.

Thus, in this example, the negative-phase output terminal (OUT−) of the first loop-filter driver 104_1 and the output terminal of the second loop-filter driver 104_2 are both connected to the connection point between the resistor element 162 and the capacitor element 164. The oscillation frequency of the oscillating unit 101 can be varied in accordance with the voltage at the node ND101 connected to the positive-phase output terminal (OUT+) of the first loop-filter driver 104_1.

In the first embodiment, the first loop-filter driver 104_1 includes a differential-output charge pump circuit DOCP which outputs a differential-output pulse current corresponding to the phase error information. The second loop-filter driver 104_2 includes a single-end charge pump circuit SECP which outputs a single-end-output pulse current corresponding to the phase error information. The charge pump circuits are simple, and are preferably used as the pulse-current output units for generating the pulse currents corresponding to the phase information.

The differential-output charge pump circuit DOCP differentially outputs the pulse current to the resistor element 162, and the single-end charge pump circuit SECP normally outputs the pulse current to the capacitor element 164. The differential pulse current from the differential-output charge pump circuit DOCP flows through both ends of the resistor element 162. The single-end pulse current from the single-end charge pump circuit SECP flows to the capacitor element 164.

If there is a difference between a source current and a sink current at the positive-phase output terminal (OUT+) and the negative-phase output terminal (OUT−) of the differential-output charge pump circuit DOCP, the difference serves as a current for charging the capacitor element 164. In the present embodiment, the difference is set to 0 so that the voltage generation at the resistor element 162 and the voltage generation at the capacitor element 164 can be performed independently of each other. Due to this characteristic, the natural frequency ωn and the damping factor ζ can be varied by changing the gains of the two pulse current output circuits (charge pump circuits in this example), and the control equations thereof can be simplified.

Either a voltage controlled oscillator circuit 101A or a current controlled oscillator circuit 101B may be used as the oscillating unit 101 disposed downstream of the loop-filter driver 104. In the case where the voltage controlled oscillator circuit 101A is used, the voltage (Vr+Vc) at the node ND101 may be supplied to a frequency control input terminal 101Ain for the oscillating operation. Here, the voltage Vr is the voltage at both ends of the resistor element 162 and the voltage Vc is the voltage at both ends of the capacitor element 164.

In the case where the current controlled oscillator circuit 101B is used, two voltage-current converters 166_1 and 166_2 and a current adder 168 is provided. One voltage-current converter 166_1 has a voltage-current conversion gain Gm1 and converts the voltage (Vr+Vc) at the node ND101 into an oscillation control current Icnt_1. The other voltage-current converter 166_2 has a voltage-current conversion gain Gm2 and converts the voltage Vc at the node ND102 into an oscillation control current Icnt_2. The current adder 168 combines the oscillation control currents Icnt_1 and Icnt_2 to generate an oscillation control current Icnt, and supplies the oscillation control current Icnt to a frequency control input terminal 101Bin of the current controlled oscillator circuit 101B.

A frequency divider 102 which divides the oscillation frequency fcco of the output oscillation signal Vout into 1/α to generate a frequency-divided oscillation signal Vout1 may be disposed downstream of the voltage controlled oscillator circuit 101A or the current controlled oscillator circuit 101B. Here, α is a division ratio that is variable, and is set to a positive integer, preferably a power of 2.

In the present embodiment, considering the connection relationship between the loop-filter driver 104 and the loop filter unit 106, the voltage controlled oscillator circuit 101A is preferably used since the circuit structure can be simplified. In such a case, the voltage-current converter 166 (transconductance) with the voltage-current conversion gain Gm can be omitted and therefore the influence of the conversion characteristic of the voltage-current converter 166 can be eliminated. In addition, noise resistance performance can be improved. This will be described in detail below.

Charge Pump Unit

Figure 4A:
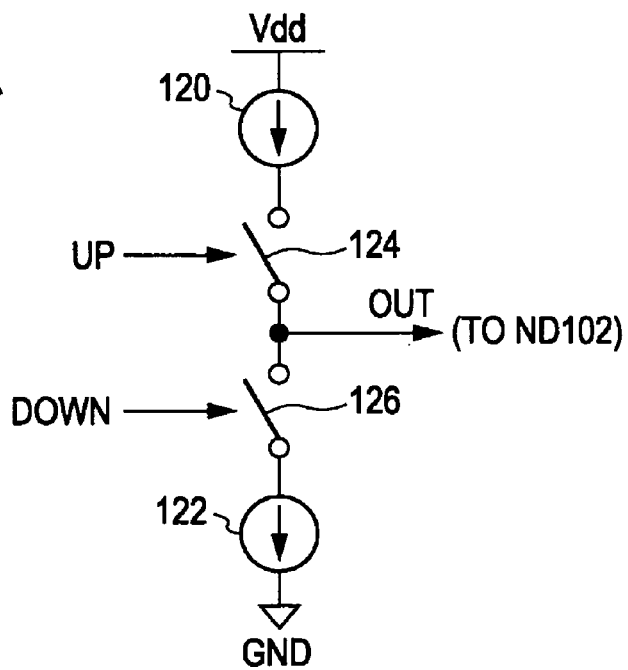
FIGS. 4A and 4B illustrate examples of the structures of charge pump circuits.
Figure 4B:
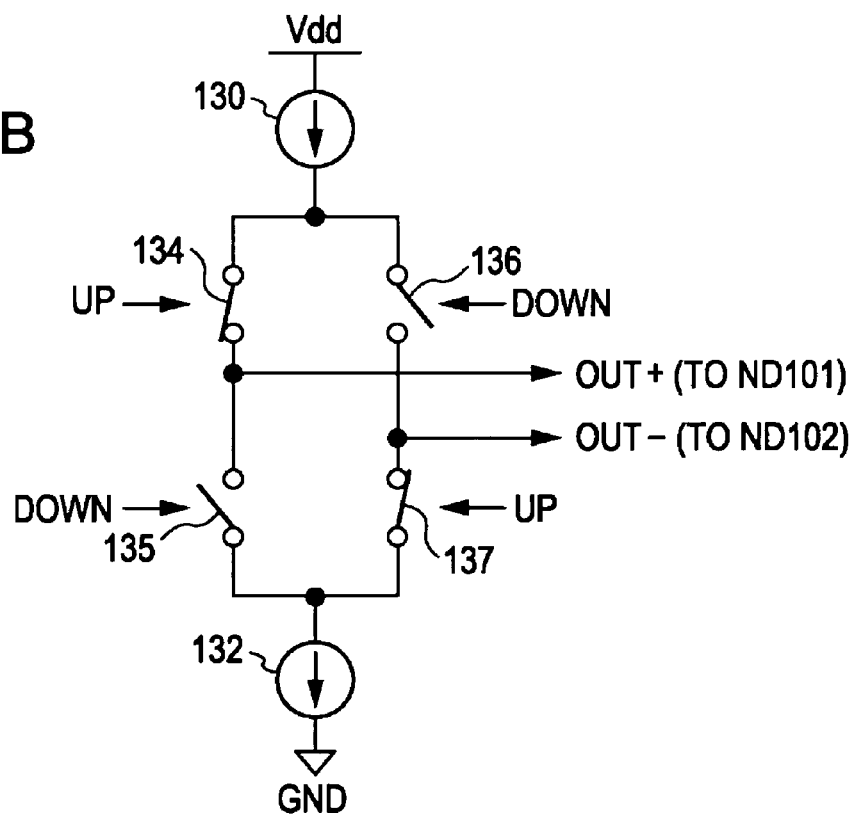

FIG. 4A is a diagram illustrating an example of the structure of the single-end charge pump circuit SECP. FIG. 4B is a diagram illustrating an example of the structure of the differential-output charge pump circuit DOCP. As shown in FIG. 4A, the single-end charge pump circuit SECP having a single-end output connected to the node ND102 includes a source-current source 120 provided at a positive source side to generate a constant source current, a sink-current source 122 provided at a reference side to generate a constant sink current, and two control switches 124 and 125. The single-end charge pump circuit SECP outputs or receives a pulse current Iout+ having a pulse width corresponding to the up/down signal UP/DOWN through an output terminal (OUT) thereof. The amount of the source current I_120 generated by the source-current source 120 and the amount of the sink current I_122 generated by the sink-current source 122 are equal to each other.

The control switch 124 is connected between the source-current source 120 and the single-end output terminal (OUT), and the control switch 125 is connected between the sink-current-source 122 and the single-end output terminal (OUT). The control switch 124 receives the up signal UP from the phase comparator 103 and the control switch 125 receives the down signal DOWN from the phase comparator 103.

The up signal UP and the down signal DOWN represent the phase error information detected by the phase comparator 103. Normally, the up signal UP and the down signal DOWN do not become active at the same time. While the up signal UP is active, the control switch 124 is switched on and the source current from the source-current source 120 is supplied to the capacitor element 164, which functions as load. Thus, the pair of current sources 120 and 122 perform a source operation. While the down signal DOWN is active, the control switch 125 is switched on and the sink current flows from the capacitor element 164, which functions as load, to the sink-current source 122. Thus, the pair of current sources 120 and 122 perform a sink operation. Thus, the single-end charge pump circuit SECP outputs or receives a pulsed drive current (hereinafter called a charge-pump current) corresponding to the phase error information detected by the phase comparator 103 to/from the capacitor element 164. The capacitor element 164 (node ND102) is controlled by the single-end charge pump circuit SECP such that the voltage Vc is generated at the ends of the capacitor element 164. The voltage Vc can be adjusted by controlling a width Δt of an active period of the up signal UP or the down signal DOWN.

The operation of the differential-output charge pump circuit DOCP having the differential outputs connected to the ends of the resistor element 162 (the node ND101 and the node ND102) is similar to that of the single-end charge pump circuit SECP except that a differential output is provided. More specifically, control switches 134 to 137 are switched on or off in accordance with the up/down signal UP/DOWN, and the differential currents corresponding to the up/down signal UP/DOWN are output accordingly. The differential charge pump circuit can be easily obtained simply by adding switching elements to the structure of the single-end charge pump circuit SECP.

More specifically, as shown in FIG. 4B, the differential-output charge pump circuit DOCP includes a source-current source 130 provided at a positive source side to generate a constant source current, a sink-current source 132 provided at a reference side to generate a constant sink current, and four control switches 134, 135, 136, and 137. The differential-output charge pump circuit DOCP outputs or receives a pulse current Iout+ and a pulse current Iout− having a pulse width corresponding to the up/down signal UP/DOWN through the positive-phase output terminal (OUT+) and the negative-phase output terminal (OUT−), respectively. The amount of the source current I_130 generated by the source-current source 130 and the amount of the sink current I_132 generated by the sink-current source 132 are equal to each other.

The control switch 134 is connected between the source-current source 120 and the positive-phase output terminal (OUT+) and the control switch 135 is connected between the sink-current source 132 and the positive-phase output terminal (OUT+). The control switch 136 is connected between the source-current source 120 and the negative-phase output terminal (OUT−) and the control switch 137 is connected between the sink-current source 132 and the negative-phase output terminal (OUT−). The control switch 134,137 receives the up signal UP from the phase comparator 103 and the control switch 135,136 receives the down signal DOWN from the phase comparator 103.

As described above, the up signal UP and the down signal DOWN represent the phase error information detected by the phase comparator 103. Normally, the up signal UP and the down signal DOWN do not become active at the same time. While the up signal UP is active, the control switch 134 is switched on and the source current from the source-current source 130 is supplied to the resistor element 162, which functions as load. In addition, the control switch 137 is switched on and the sink current flows from the resistor element 162, which functions as load, to the sink-current source 132. At this time, the current flows through the resistor element 162 in the direction from the node ND101 to the node ND102. While the down signal DOWN is active, the control switch 136 is switched on and the source current from the source-current source 130 is supplied to the resistor element 162, which functions as load. In addition, the control switch 135 is switched on and the sink current flows from the resistor element 162, which functions as load, to the sink-current source 132. At this time, the current flows through the resistor element 162 in the direction from the node ND102 to the node ND101.

Thus, the differential-output charge pump circuit DOCP outputs or receives a pulsed drive current (charge-pump current) corresponding to the phase error information detected by the phase comparator 103 to/from the resistor element 162. At this time, if the amount of the source current I_130 generated by the source-current source 130 and the amount of the sink current I_132 generated by the sink-current source 132 are equal to each other, the current is consumed only by the resistor element 162 and is not used to charge the capacitor element 164 irrespective of whether the up signal UP or the down signal DOWN is active and irrespective of the pulse width of the active signal. Assuming that the amount of the source current I_130 and the amount of the sink current I_132 are both equal to I_R, that the active period width of the up signal UP and the down signal DOWN is Δt, and that the resistance of the resistor element 162 is R_162, the voltage Vr at the ends of the resistor element 162 can be calculated as I_R×Δt×R_162. The voltage Vr at the ends of the resistor element 162 can be adjusted by controlling the active period width Δt of the up signal UP or the down signal DOWN. The direction in which the current flows through the resistor element 162 switches depending on whether the up signal UP is active or the down signal DOWN is active. Therefore, the voltage Vr with which the oscillating unit 101 can be controlled such that the phase thereof is maintained constant can be generated at the resistor element 162 only by the differential-output charge pump circuit DOCP.

The voltage Vr at the ends of the resistor element 162 is added to the voltage Vc at the node ND102, and is supplied to the oscillating unit 101 as a loop filter voltage Vloop. The voltage Vr and the voltage Vc are both controlled on the basis of the up/down signal UP/DOWN which represents the phase error information. Therefore, the output frequency of the oscillating unit 101 is controlled so as to eliminate the phase error information. Thus, the basic operation as the phase-locked loop circuit is similar to that of a common structure.

Loop Characteristics of Phase-Locked Loop Unit

First Embodiment

The loop characteristics of the phase-locked loop unit 100A according to the first embodiment will now be described in more detail. A linearized closed-loop transfer function, which is generally used for the analysis of a so-called charge-pump PLL, may be used to analyze the operation of the phase-locked loop unit 100.

In the phase-locked loop unit 100A of the first embodiment, when Kosci is the input/oscillation-frequency conversion gain of the oscillating unit 101, R is the resistance (resistance R_162 of the resistor element 162), C is the capacitance (capacitance C_164 of the capacitor element 164), Kcpr is a CPR circuit gain, and Kcpc is a CPC circuit gain, the natural frequency ωn and the damping factor ζ may be expressed as Equations (3-1) and (3-2) (Expression (3)). Here, the CPR circuit gain Kcpr is the circuit gain of the first loop-filter driver 104_1 including the differential-output charge pump circuit DOCP, and the CPC circuit gain Kcpc is the circuit gain of the second loop-filter driver 104_2 including the single-end charge pump circuit SECP.

$$\left.\begin{array}{ll}\omega_n = \sqrt{\dfrac{K_{CPC}K_{VCO}}{C}} & (3\text{-}1) \\[2mm] \zeta = \dfrac{RC}{2}\dfrac{K_{CPR}}{K_{CPC}}\omega_n & (3\text{-}2)\end{array}\right\} \quad (3)$$

When, for example, the phase-locked loop unit 100A is used in the read/write apparatus 1, the natural frequency con expressed as Equation (3-1) is set to a value determined by the standards for the three types of optical disks PD, that is, the next generation DVD, normal DVD, and CD, by the following method. That is, in the case where the phase-locked loop unit 100A is formed as an IC, the resistance R and the capacitance C are fixed. Therefore, the charge-pump current Icp, the division ratio α of the frequency divider 102, or the input/oscillation-frequency conversion gain Kosci are adjusted.

As is clear from Expression (3), according to the present embodiment, the natural frequency ωn and the damping factor ζ can be varied by changing the CPC circuit gain Kcpc and the CPR circuit gain Kcpr even when the capacitance C and the resistance R are constant. Thus, a high-performance PLL circuit in which the natural frequency ωn and the damping factor ζ can be varied is obtained. In the basic structure of the first embodiment, the resistor element 162 is driven by the differential-output charge pump circuit DOCP. Therefore, control equations used when the gains Kcpc and Kcpr of the two charge pump circuits are changed to adjust the natural frequency ωn and the damping factor ζ are simple.

Since the single-end pulse output circuit (single-end charge pump circuit SECP) and the differential pulse output circuit (differential-output charge pump circuit DOCP) are used in combination, a high-performance PLL circuit in which the natural frequency ωn and the damping factor ζ can be varied without switching between the resistor circuits or the integrating circuits (capacitor circuits) can be obtained.

In the structure of the phase-locked loop unit 100A according to the first embodiment, different from the structure of Japanese Unexamined Patent Application Publication No. 10-84279, the addition of the outputs of the two charge pumps DOCP and SECP is performed on the basis of voltage instead of current, and the loop filter voltage Vloop is obtained as a result of the addition. Therefore, the input to the oscillating unit 101 is a voltage, and the voltage controlled oscillator circuit 101A is preferably used as the oscillating unit 101 instead of the current controlled oscillator circuit 101B, as described above. In the case where the voltage controlled oscillator circuit 101A is used, the circuit structure is simple. In addition, the voltage-current converter (transconductance) with the voltage-current conversion gain Gm can be omitted, and therefore the influence of the conversion characteristics of the voltage-current converter can be eliminated. When, for example, a ring oscillator is used, a substantially linear relationship can be obtained between the voltage and the oscillation frequency, and additional analog circuits, such as a Gm circuit and a current squared circuit, for current-voltage conversion can be omitted. Since the above-mentioned circuits can be omitted, the noise thereof is not applied to the phase-locked loop unit 100A, and a high-accuracy output can be obtained from the phase-locked loop circuit. In addition, the design process for the above-mentioned additional analog circuits can be omitted and it is not necessary to provide chip areas for arranging the additional analog circuits. In addition, a structure in which characteristics of the noise performance, the circuit scale, and the design and verification processes are balanced is provided.

Phase-Locked Loop Unit of Second Embodiment

Basic Structure

Figure 5:
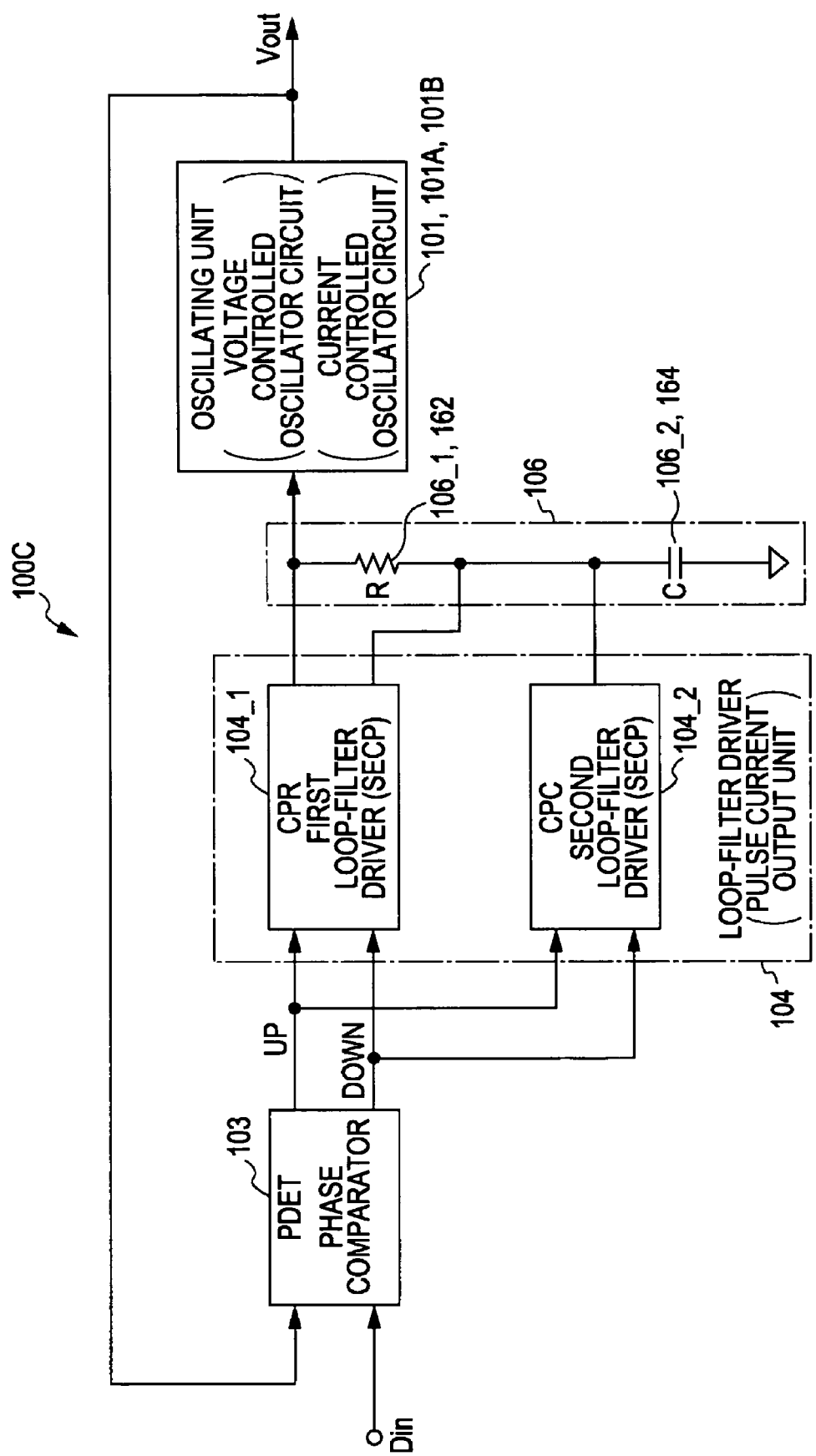
FIG. 5 is a functional block diagram illustrating the basic structure of a phase-locked loop unit according to a second embodiment.

FIG. 5 is a functional block diagram illustrating the basic structure of a phase-locked loop unit 100C according to a second embodiment. The phase-locked loop unit 100C according to the second embodiment differs from the phase-locked loop unit 100A according to the first embodiment in the following point. That is, similar to the second loop-filter driver 104_2, the first loop-filter driver 104_1 also includes a single-end charge pump circuit SECP which outputs a single-end-output pulse current corresponding to the phase error information on the basis of the up/down signal UP/DOWN from the phase comparator 103. Other structures of the phase-locked loop unit 100C is similar to those of the phase-locked loop unit 100A according to the first embodiment.

Similar to the phase-locked loop unit 100A according to the first embodiment, the phase-locked loop unit 100C according to the second embodiment also differs from the structure of Japanese Unexamined Patent Application Publication No. 10-84279, in that the addition of the outputs of the two charge pumps SECP and SECP is performed on the basis of voltage instead of current, and the loop filter voltage Vloop is obtained as a result of the addition. Therefore, similar to the first embodiment, the voltage controlled oscillating unit 101A is preferably used as the oscillating unit 101. As a result, the analog circuits, such as the Gm circuit and the current squared circuit, for current-voltage conversion can be omitted. Therefore, a high-accuracy output can be obtained from the phase-locked loop circuit. In addition, the design process for the above-mentioned additional analog circuits can be omitted and it is not necessary to provide chip areas for arranging the additional analog circuits.

However, in the phase-locked loop unit 100C according to the second embodiment, the source current and the sink current from the single-end charge pump circuit SECP included in the first loop-filter driver 104_1 affect the capacitance element 164. Therefore, the natural frequency ωn and the damping factor ζ can be expressed as Equations (4-1) and (4-2) (Expression (4)). Here, the CPR circuit gain Kcpr is the circuit gain of the first loop-filter driver 104_1 including the single-end charge pump circuit SECP, and the CPC circuit gain Kcpc is the circuit gain of the second loop-filter driver 104_2 including the single-end charge pump circuit SECP.

$$\left.\begin{array}{ll}\omega_n = \sqrt{\dfrac{(K_{CPR}+K_{CPC})K_{VCO}}{C}} & (4\text{-}1) \\[2mm] \zeta = \dfrac{RC}{2}\dfrac{K_{CPR}}{K_{CPR}+K_{CPC}}\omega_n & (4\text{-}2)\end{array}\right\} \quad (4)$$

As is clear from Expression (4), the relationship between the natural frequency ωn, the damping factor ζ, the CPC circuit gain Kcpc, and the CPR circuit gain Kcpr are more complex than that in Expression (3). Therefore, there is a disadvantage that the control of the CPC circuit gain Kcpc and the CPR circuit gain Kcpr is complex. In particular, in the case where the natural frequency on and the damping factor ζ are to be finely varied, the difference in the complexity of control is crucial.

Phase-Locked Loop Unit of Third Embodiment

Basic Structure

Figure 6:
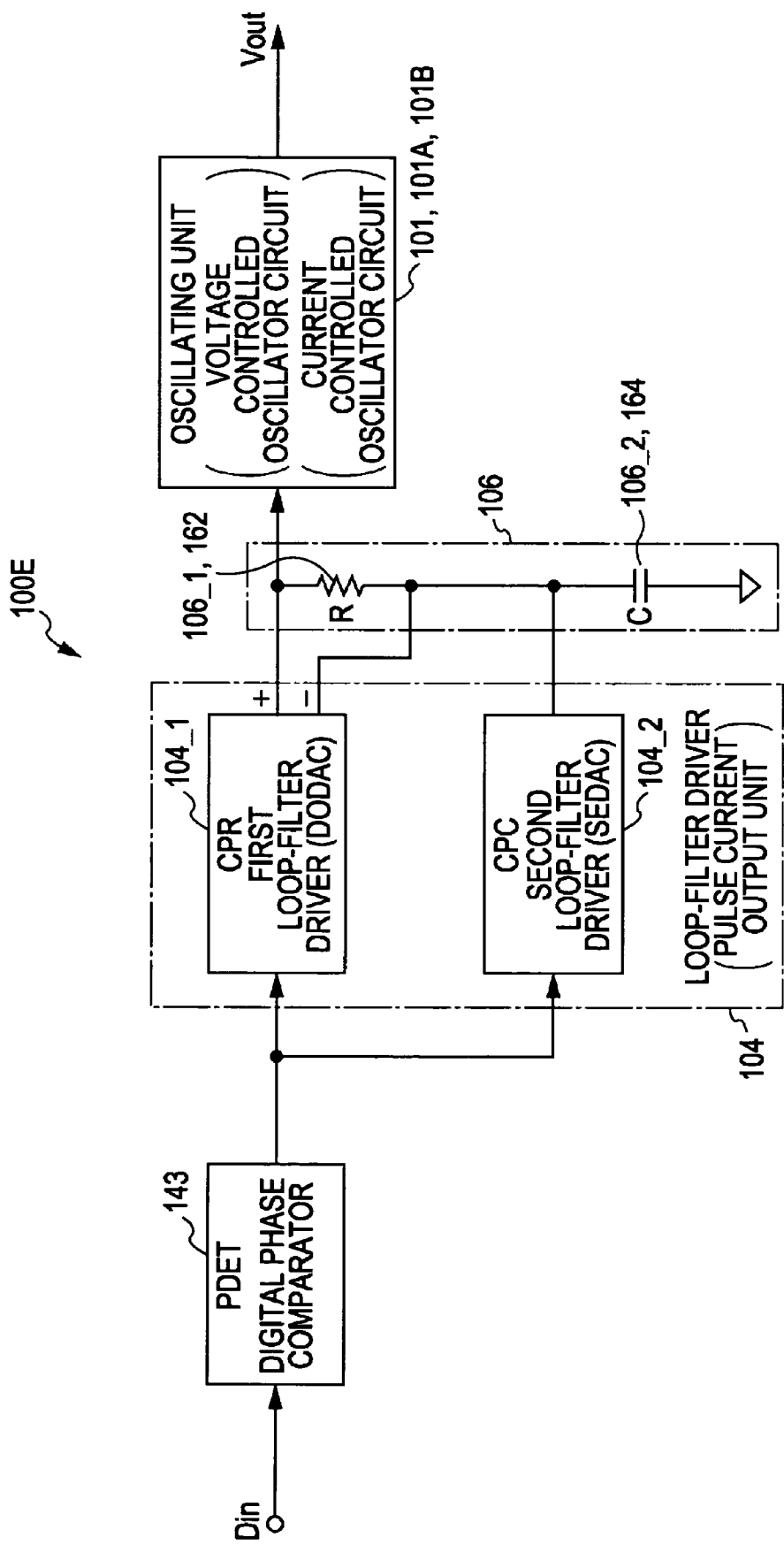
FIG. 6 is a functional block diagram illustrating the basic structure of a phase-locked loop unit according to a third embodiment.
Figure 9A:
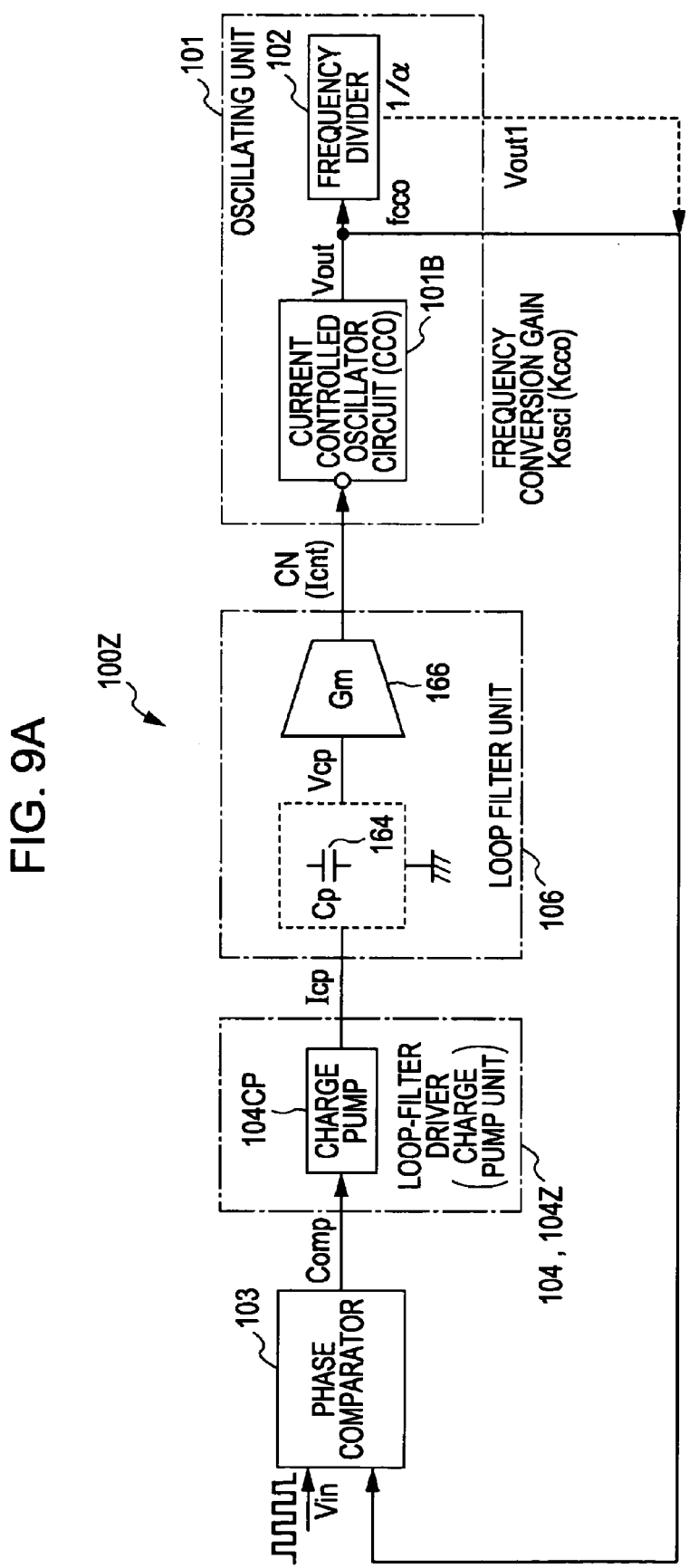
FIG. 9A is a circuit block diagram of a common phase-locked loop circuit.
Figure 9B:
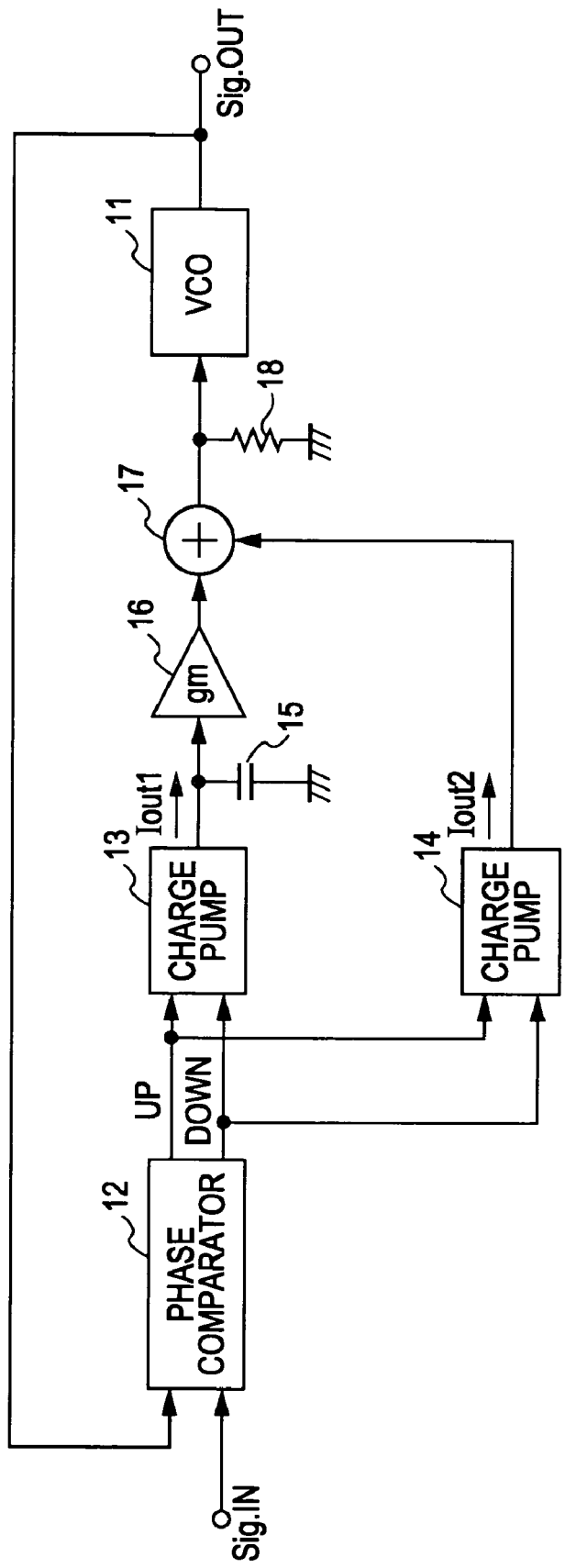
FIG. 9B shows a phase-locked loop circuit disclosed in Patent Document 1.

FIG. 6 is a functional block diagram illustrating the basic structure of a phase-locked loop unit 100E according to a third embodiment. The phase-locked loop unit 100E according to the third embodiment differs from the phase-locked loop unit 100A according to the first embodiment in the following point. That is, the phase comparator 103 is replaced by a digital phase detection unit 143. In addition, the first loop-filter driver 104_1 includes a current-output DA converter (digital to analog converter (DAC)) circuit of a differential output type in place of the differential-output charge pump circuit DOCP, and the second loop-filter driver 104_2 includes a current-output DA converter circuit of a single-end output type in place of the single-end charge pump circuit SECP. Other structures of the phase-locked loop unit 100E is similar to those of the phase-locked loop unit 100A according to the first embodiment. The phase-locked loop unit 100E according to the third embodiment is suitable for use as a clock recovery circuit used in a signal processing system in the read/write apparatus 1, such as an optical disk driving apparatus.

The digital phase detection unit 143 digitally extracts phase information (up-down signal UpDown) from digital data (digital data sequence Din) input thereto, and supplies the phase information to the first loop-filter driver 104_1 and the second loop-filter driver 104_2. Accordingly, the phase-locked loop unit 100E generates a clock on the basis of the phase information in the form of digital data supplied from the digital phase detection unit 143. This clock can be fed to the AD converter 54 as a sampling clock (recovery clock).

The current-output DA converter circuits convert the N-bit phase error information detected by the digital phase detection unit 143 into analog signals. The current-output DA converter circuit of the differential output type is called a differential-output DA converter circuit DODAC, and the current-output DA converter circuit of the single-end output type is called a single-end-output DA converter circuit SEDAC.

The digital phase detection unit 143 digitally extracts the phase information from the digital data sequence Din and supplies the phase information (up/down signal UP/DOWN) to the first loop-filter driver 104_1 including the differential-output DA converter circuit DODAC and the second loop-filter driver 104_2 including the single-end-output DA converter circuit SEDAC.

The differential-output DA converter circuit DODAC outputs or receives a pulse current Iout+ and a pulse current Iout− having a wave height (pulse height) corresponding to the phase information (up/down signal UP/DOWN) from the digital phase detection unit 143 through a positive-phase output terminal (OUT+) and a negative-phase output terminal (OUT−), respectively. A resistance element 162 is connected between the positive-phase output terminal (OUT+) and the negative-phase output terminal (OUT−) of the differential-output DA converter circuit DODAC. Similar to the case in which the differential-output charge pump circuit DOCP is used, assuming that the amount of the source current I_130 and the amount of the sink current I_132 are both equal to I_R, that the active period width of the up signal UP and the down signal DOWN is Δt, and that the resistance of the resistor element 162 is R_162, the voltage Vr at the ends of the resistor element 162 can be calculated as I_R×Δt×R_162. The voltage Vr at the ends of the resistor element 162 can be adjusted by controlling the active period width Δt of the up signal UP or the down signal DOWN.

The single-end-output DA converter circuit SEDAC outputs or receives a pulse current Iout having a wave height (pulse height) corresponding to the phase information (up/down signal UP/DOWN) from the digital phase detection unit 143 through an output terminal (OUT) thereof. A capacitance element 164 is connected between the output terminal (OUT) of the single-end-output DA converter circuit SEDAC and a reference point. Similar to the case in which the single-end charge pump circuit SECP is used, a voltage Vc is generated at the capacitance element 164 (node ND102) due to the control of the single-end-output DA converter circuit SEDAC. The voltage Vc can be adjusted by controlling the active period width Δt of the up signal UP or the down signal DOWN.

Similar to the first embodiment, the voltage Vr at the ends of the resistor element 162 and the voltage Vc at the node ND102 are added together, and the thus-obtained sum is supplied to the oscillating unit 101 as a loop filter voltage Vloop. The phase-locked loop unit 100E of the third embodiment differs from the phase-locked loop unit 100A of the first embodiment in that the loop-filter driver 104 (the first loop-filter driver 104_1 and the second loop-filter driver 104_2) includes the DA converter circuits DODAC and SEDAC, which respectively output the differential pulse currents (pulse current Iout+ and pulse current Iout−) and the single-end pulse current Iout having a wave height corresponding to the phase information (up/down signal UP/DOWN) from the digital phase detection unit 143. However, the basis operation of the phase-locked loop unit 100E according to the third embodiment is similar to that of the phase-locked loop unit 100A of the first embodiment. Therefore, effects similar to those of the first embodiment can be obtained.

More specifically, the natural frequency ωn and the damping factor ζ can be varied without changing the capacitance C and the resistance R by controlling the circuit gains of the DA converter circuits DODAC and SEDAC. In the basic structure of the third embodiment, the resistor element 162 is driven by the differential-output DA converter circuit DODAC. Therefore, control equations used when the gains Kcpc and Kcpr of the two DA converter circuits DODAC and SEDAC are changed to adjust the natural frequency ωn and the damping factor ζ are simple.

Since the single-end pulse output circuit (single-end-output DA converter circuit SEDAC) and the differential pulse output circuit (differential-output DA converter circuit DODAC) are used in combination, a high-performance PLL circuit in which the natural frequency ωn and the damping factor ζ can be varied without switching between the resistor circuits or the capacitor circuits can be obtained.

Similar to the first embodiment, also in the third embodiment, the addition of the outputs of the two DA converter circuits DODAC and SEDAC is performed on the basis of voltage instead of current, and the loop filter voltage Vloop is obtained as a result of the addition. When the voltage controlled oscillating unit 101A is used as the oscillating unit 101, the analog circuits for current-voltage conversion can be omitted. Therefore, a high-accuracy output can be obtained from the phase-locked loop circuit. In addition, the design process for the above-mentioned additional analog circuits can be omitted and it is not necessary to provide chip areas for arranging the additional analog circuits.

Current-Output DA Converter Circuit

FIG. 7 is a diagram illustrating an example of the structure of the single-end-output DA converter circuit SEDAC. FIG. 8 is a diagram illustrating an example of the structure of the differential-output DA converter circuit DODAC.

As shown in FIG. 7, the single-end-output DA converter circuit SEDAC includes N source-current sources 502 and N sink-current sources 504 corresponding to respective bits, control switches 506 and 508 for selectively combining outputs from the current sources 502 and 504, and switching units 510. In FIG. 7, only the components for the highest order bit MSB are denoted by the reference numerals. Each of the switching units 510 corresponds to a pair of current sources including a single source-current source 502 and a single sink-current source 504 with the same amount of current, and controls the corresponding control switches 506 and 508 on the basis of a control signal Control and the up-down signal UpDown. Only when the control signal Control is effective (H level), the pair of current sources 502 and 504 (also referred to as a single-bit current source 501) outputs or receives one of the source current and the sink current on the basis of the up-down signal UpDown output from the digital phase detection unit 143.

Each of the source-current sources 502 is connected to a source at one end and to the corresponding control switch 506 at the other end. Each of the sink-current sources 504 is connected to a reference potential (ground potential GND) at one end and to the corresponding control switch 508 at the other end. The amount of source current and the amount of sink current are equal to each other for each bit.

An end of the control switch 506 for each bit opposite the source-current source 502 is connected to an end of the control switch 508 for the corresponding bit opposite the sink current source 504, and the connection point therebetween is connected to an output terminal (OUT) which is common for all of the bits. The sum of the currents at the respective bits is output from the output terminal (OUT) connected to the node ND102.

The switching unit 510 of each bit controls the on/off states of the control switches 506 and 508 in accordance with the data of the corresponding bit which shows the phase detection result obtained by the digital phase detection unit 143. Thus, the single-bit current source 501 selectively generates one of the source current and the sink current.

To perform the above-described operation, each switching unit 510 includes an inverter 512 which logically inverts the up-down signal UpDown [N-#] (# is 1, 2, 3, . . . , where 1 corresponds to MSB) for the corresponding bit which is output from the digital phase detection unit 143, and two two-input AND gates 514 and 516.

The AND gate 514 receives a signal obtained by logically inverting the up-down signal UpDown [N-#] with the inverter 512 at one input terminal, and receives a control signal Control [N-#] (# is 1, 2, 3, . . . , where 1 corresponds to MSB) for the corresponding bit from the digital phase detection unit 143 at the other input terminal. An output from the AND gate 514 is supplied to a control terminal of the control switch 506 connected to the source-current source 502. The AND gate 516 receives the up-down signal UpDown [N-#] at one input terminal, and receives the control signal Control [N-#] at the other input terminal. An output from the AND gate 516 is supplied to a control terminal of the control switch 508 connected to the sink-current source 504.

The source-current source 502 or the sink-current source 504 serves to source or sink the current by an amount corresponding to the weight of the corresponding bit. For example, the amount of current is set to a maximum amount I for the highest order bit, and is reduced by a factor of ½ (or a factor higher than ½) for each bit as the order decreases. Preferably, when the amount of current for MSB is I, the amount of current is reduced stepwise to $I/\{2^\&\}$ (& is 1, 2, . . . , N−2, N−1). In this example, a scaling x is set to ½, and the bits are weighted by powers of ½.

For each pair of current sources including a single source-current source 502 and a single sink-current source 504 with the same amount of current, the corresponding control switches 506 and 508 are controlled on the basis of the control signal Control and the up-down signal UpDown. Only when the control signal Control is effective (H level), the pair of current sources 502 and 504 (also referred to as a single-bit current source 501) outputs or receives one of the source current and the sink current on the basis of the up-down signal UpDown output from the digital phase detection unit 143.

More specifically, when the up-down signal UpDown is at the H level, the output of the AND gate 514 is at the L level and the output of the AND gate 516 is at the H level. Accordingly, the control switch 506 is turned off since the control terminal thereof is at the L level, and the control switch 508 is turned on since the control level thereof is at the H level. As a result, the pair of current sources 502 and 504 performs a sink operation.

When the up-down signal UpDown is at the L level, the output of the AND gate 514 is at the H level and the output of the AND gate 516 is at the L level. Accordingly, the control switch 506 is turned on since the control terminal thereof is at the H level, and the control switch 508 is turned off since the control level thereof is at the L level. As a result, the pair of current sources 502 and 504 performs a source operation.

As shown in FIG. 8, the differential-output DA converter circuit DODAC includes two control switches 507 and 509 in addition to the structure of the single-end-output DA converter circuit SEDAC. A DA output signal for the negative-phase output terminal (OUT−) connected to the node ND102 can be obtained by using a technique similar to that used in the differential-output charge pump circuit DOCP obtained by modifying the single-end charge pump circuit SECP. The output terminal (OUT) of the single-end-output DA converter circuit SEDAC is used as the positive-phase output terminal (OUT+) connected to the node ND101. The control switch 507 and the control switch 506 are controlled together by the AND gate 514.

The control switch 509 and the control switch 508 are controlled together by the AND gate 516. An end of the control switch 507 for each bit opposite the source-current source 502 and an end of the control switch 509 for the corresponding bit opposite the sink current source 504 are connected to each other, and the connection point therebetween is connected to the negative-phase output terminal (OUT−) which is common for all of the bits. The sum of the currents at the respective bits is output from the positive-phase output terminal (OUT+).

Although the embodiments of the present invention have been described, the technical scope of the present invention is not limited to the scope of the above-described embodiments. Various modifications and improvements can be made within the gist of the present invention, and such modifications and improvements are included in the technical scope of the present invention.

The above-described embodiments do not limit the claimed invention, and not all of the combinations of the features described in the embodiments are necessary for carrying out the invention. The above-described embodiments include various stages of the invention, and various forms of the invention can be obtained by suitable combinations of the features described in the embodiments. Even when some of the features described in the embodiments are omitted, the remaining features form the present invention as long as the advantage of the present invention can be obtained.

For example, although the optical disk apparatus is described as the read/write apparatus in the above-described embodiments, the read/write apparatus is not limited to the optical disk apparatus, and may also be, for example, a hard disk driving apparatus. The hard disk driving apparatus also uses a clock recovery circuit and a write clock generator circuit. The phase-locked loop unit 100 according to the above-described embodiments may be used as the clock recovery circuit or the write clock generator circuit.

In addition to the optical disk apparatus or the hard disk driving apparatus, the phase-locked loop unit 100 may also be used in other types of read/write apparatuses, such as a digital VTR and a digital VCR, as a clock recovery circuit for generating a recovery clock on the basis of the phase information of a reproduction signal obtained from a recording medium.

In addition to the read/write apparatus, the present invention may also be applied to, for example, an apparatus for setting a timing of a reception signal line, such as an input/output interface for a serial communication through a medium such as a twist pair metal cable and a fiber cable or for an inter-chip communication. In addition, the present invention may also applied to other types of electronic apparatuses.

The present application contains subject matter related to that disclosed in Japanese Priority Patent Application JP 2008-197474 filed in the Japan Patent Office on Jul. 31, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A phase-locked loop circuit comprising:
a first loop-filter driver configured to supply a positive-phase pulse current to a connection point, said connection point being electrically connected to a frequency control input terminal of an oscillator and to a terminal of a resistor circuit;
a second loop-filter driver configured to supply a single-end pulse current to a node, said node being electrically connected to another terminal of the resistor circuit and to an electrode of a capacitor circuit,
wherein said first loop-filter driver includes a negative-phase output terminal, said negative-phase output terminal being electrically connected to said another terminal of the resistor circuit.

2. The phase-locked loop circuit according to claim 1, wherein said oscillator is a current controlled oscillator circuit or a voltage controlled oscillator circuit.

3. The phase-locked loop circuit according to claim 1, wherein said resistor circuit is a resistor.

4. The phase-locked loop circuit according to claim 1, wherein said capacitor circuit is a capacitor.

5. The phase-locked loop circuit according to claim 1, wherein another electrode of the capacitor circuit is electrically connected to a reference potential.

6. The phase-locked loop circuit according to claim 5, wherein said reference potential is ground potential.

7. The phase-locked loop circuit according to claim 1, wherein a phase comparator is configured to detect phase information of a digital data sequence.

8. The phase-locked loop circuit according to claim 7, wherein said phase information identifies a phase difference between said digital data sequence and an output oscillation signal, said oscillator being configured to output said output oscillation signal.

9. The phase-locked loop circuit according to claim 8, wherein said oscillator is configured to vary an oscillation frequency of said output oscillation signal.

10. The phase-locked loop circuit according to claim 8, wherein said first loop-filter driver includes a positive-phase output terminal, a first loop-filter source-current source, a first loop-filter sink-current-source, and first loop-filter control switches.

11. The phase-locked loop circuit according to claim 10, wherein said positive-phase output terminal is electrically connected to said connection point, said positive-phase pulse current being output to said positive-phase output terminal.

12. The phase-locked loop circuit according to claim 10, wherein said phase information configures said first loop-filter control switches.

13. The phase-locked loop circuit according to claim 10, wherein said first loop-filter control switches are configurable to connect said positive-phase output terminal to said first loop-filter source-current source or said first loop-filter sink-current-source.

14. The phase-locked loop circuit according to claim 1, wherein said first loop-filter control switches are configurable to connect said positive-phase output terminal to said source-current source and said negative-phase output terminal to said sink-current-source.

15. The phase-locked loop circuit according to claim 1, wherein said first loop-filter control switches are configurable to connect said negative-phase output terminal to said source-current source and said positive-phase output terminal to said sink-current-source.

16. The phase-locked loop circuit according to claim 8, wherein said second loop-filter driver includes a single-end output terminal, a second loop-filter source-current source, a second loop-filter sink-current-source, and second loop-filter control switches.

17. The phase-locked loop circuit according to claim 16, wherein said single-end output terminal is electrically connected to said node, said single-end pulse current being output to said single-end output terminal.

18. The phase-locked loop circuit according to claim 16, wherein said phase information configures said second loop-filter control switches.

19. The phase-locked loop circuit according to claim 16, wherein said second loop-filter control switches are configurable to connect said single-end output terminal to said source-current source or said sink-current-source.

20. The phase-locked loop circuit according to claim 7, wherein said phase comparator is a digital phase detection unit, said phase information being digital information.

21. The phase-locked loop circuit according to claim 20, wherein said first loop-filter driver is configured to convert said phase information into an analog differential-output, a positive-phase output of the analog differential-output being supplied to said connection point and a negative-phase output of the analog differential-output output being supplied to said node.

22. The phase-locked loop circuit according to claim 20, wherein said second loop-filter driver is configured to convert said phase information into an analog single-end-output, said analog single-end-output being supplied to said node.

* * * * *